(12) United States Patent
Sanders

(10) Patent No.: US 7,024,009 B2
(45) Date of Patent: Apr. 4, 2006

(54) REMOVABLE TEMPLATE FOR AUDIO AMPLIFICATION SYSTEM

(76) Inventor: Jon Sanders, 14 Ham St., Newmarket, NH (US) 03857

( * ) Notice: Subject to any disclaimer, the term of this patent is extended or adjusted under 35 U.S.C. 154(b) by 333 days.

(21) Appl. No.: 10/047,309

(22) Filed: Jan. 15, 2002

(65) Prior Publication Data
US 2003/0133580 A1 Jul. 17, 2003

(51) Int. Cl.
H04B 1/00 (2006.01)

(52) U.S. Cl. ............................ 381/124; 381/119; 33/562

(58) Field of Classification Search ................ 381/120, 381/121, 98, 61, 87, 124, 60, 58, 59, 56, 381/119; 73/585; 33/562–565
See application file for complete search history.

(56) References Cited

U.S. PATENT DOCUMENTS 2,663,377 A * 12/1953 Grandjot ...................... 73/585
4,011,671 A * 3/1977 Fogel et al. ................. 434/430
4,677,674 A * 6/1987 Snyder ......................... 381/58

OTHER PUBLICATIONS

Challoner, Jack; "The Science Book of Numbers", 1992, Dorling Kindersley Limited, pps. 20–21, 28–29.*

* cited by examiner

*Primary Examiner*—Ping Lee
(74) *Attorney, Agent, or Firm*—Pierce Atwood; Kevin M. Farrell

(57) ABSTRACT

Disclosed is a removable template for recording custom settings on an audio amplification system, or components thereof. The template comprises a template blank shaped for accommodation by an amplifier control panel, the template blank having cut-outs or bores facilitating the application of the template to the amplifier control panel, and the subsequent operation of said control panel. The template blank further comprises a surface for marking control settings and related indicia.

16 Claims, 1 Drawing Sheet

REMOVABLE TEMPLATE FOR AUDIO AMPLIFICATION SYSTEM

BACKGROUND OF THE INVENTION

Audio amplification systems are sophisticated electronic components, or combinations thereof, having a myriad of inputs, outputs and control features. In a stand-alone use, individual audio amplifiers may be associated with, for example, a single musical instrument. In a multi-piece band, a plurality of individual amplifiers must be "tuned" to provide a desired overall audio effect. This "tuning" process is often venue-dependent due to differences in the overall acoustics of the venue. Amplifier settings which result in a desirable net audio output in an intimate club setting, may be totally unacceptable in an outdoor venue, for example.

Typically, during equipment set-up, general settings are made based on experience. These settings are then refined during a sound-check procedure. Depending upon the complexity of the amplification system, this can be a very time consuming and frustrating process.

A simple method for recording control settings and related information would substantially reduce the time associated with fine-tuning an amplification system for a particular venue.

SUMMARY OF THE INVENTION

The present invention relates to a removable template for recording custom settings on an audio amplification system, or components thereof. The template comprises a template blank shaped for accommodation by an amplifier control panel, the template blank having cut-outs or bores facilitating the application of the template to the amplifier control panel, and the subsequent operation of said control panel. The template blank further comprises a surface for marking control settings and related indicia.

DETAILED DESCRIPTION OF PREFERRED EMBODIMENTS

Figure 1:
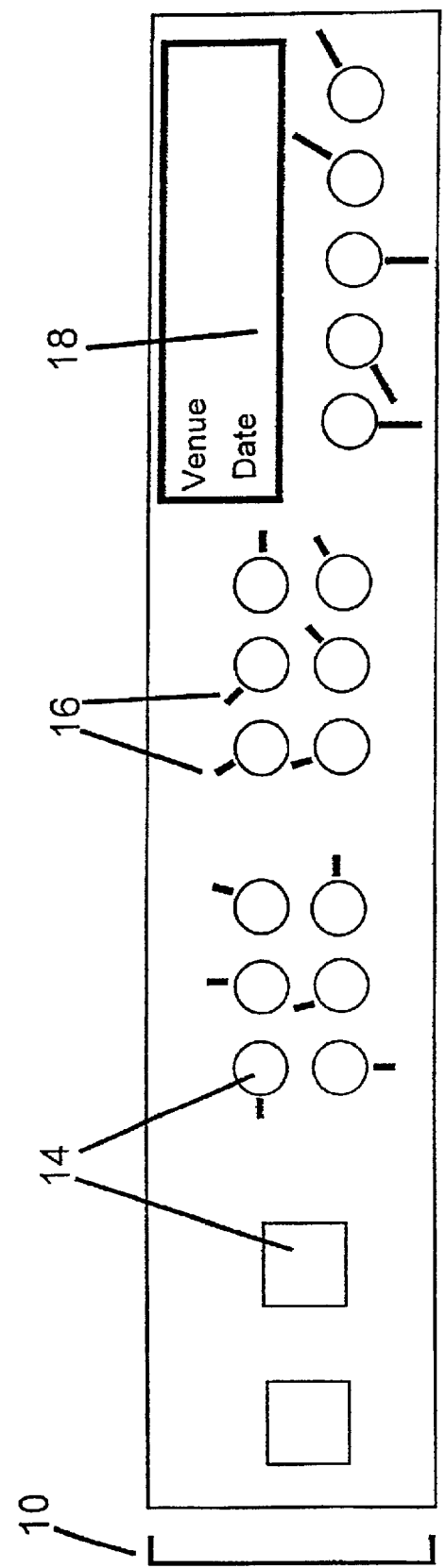
FIG. 1 shows the removal template according to this invention.

The present invention relates to a removable template for recording custom settings on an audio amplification system, or components thereof. This can include, for example, amplifiers, mixing boards, effect pedals, etc.

Referring to FIG. 1, the template comprises a template blank (10), shaped for accommodation by an amplifier control panel (not shown). The template blank is machined or molded to contain cut-outs, bores, voids, or the like (14), which facilitate the application of the template to the amplifier control panel, and the subsequent operation of the control panel. Essentially, the cut-out, bores, voids or the like (which will be referred to below as "cut-outs", for convenience), replicate the area occupied by a particular control or feature on an amplifier control panel, or related electronic component. In preferred embodiments, each cut-out is labelled to indicate the function of the knob or switch to which it corresponds. Such labelling has been omitted in FIG. 1.

When positioned over the control panel of an amplification system, or a component of an amplification system, the exposed surface of the template provides a convenient surface for marking control settings and related information.

FIG. 1 shows marking (16) depicting desired control settings. In addition, FIG. 1 shows an area for recording information (18) related to the settings, in this case, venue and date information.

The template blank is preferably cut or molded from a stock material. In preferred embodiments, the stock material is a plastic. Plastic offers a variety of advantages for this application. Plastic is inexpensive relative to alternative materials and is easily cut or formed. In addition, plastics generally provide an acceptable surface for marking with a writing instrument (e.g., Sharpie brand permanent marker). Furthermore, plastics are generally not degraded through contact with a solvent of the type necessary to remove markings produced using a "permanent marker". Ethanol is an example of such a solvent.

One of skill in the art will recognize that a great many distinct types of plastic materials are available. Applicant is not aware of any type of plastic which would be totally unsuitable for this application. Prototypes have been produced from 1/16" acrylic stock.

Plastics are also a good material for graphics presentation. Plastics can be produced in thousands of shades of color, with or without the introduction of patterns using multiple colors. Lettering can also be applied, for example, to label various control knobs and switches. In addition, plastics represent an excellent substrate for the application of graphics stickers or decals. Such stickers or decals could be applied to plastic stock prior to the introduction of cut-outs. Alternatively, cut-outs could be produced in the sticker or decal to match the position of cut-outs in the template. Sticker or decal stock material (e.g., vinyl) is an excellent surface for marking with a writing instrument such as a permanent marker.

The template of the present invention could be produced in a variety of ways using a plastic material. For example, the template could be die-cut from sheet stock, trimmed from sheet stock using a computer-controlled trimming instrument (e.g., a saw blade or laser), or injection molded.

In addition to plastics, the template of the present invention could be produced from a variety of other materials. A template could be cut from wood, paper or metal stock material, or formed from a foam material, for example.

The template may be fixed to the surface of an amplifier control panel using, for example, double-sided mounting tape. Such tape has substantial thickness (e.g., 1/16") which would function as a stand-off producing element offering the advantage of eliminating or substantially reducing vibration issues which could produce unwanted sound. Other forms of adhesive, or a hook and loop fastening means could be employed to attach a template to a control panel. For amplifiers having a metal control panel face plate, it may be desirable to attach a magnetic backing material to the template for easy application and removal. In many applications, it may prove unnecessary to physically attach the control panel and the template.

As previously stated, when applied to the control panel of an amplifier or a component of an amplification system, various control settings can be marked. In addition, space may be provided for recording other indicia or related information (18). For example, the date and performance venue may be recorded. After such a performance, one or more templates could be archived, and retrieved for use at the same or similar venue on another occasion.

What is claimed is:

1. A removable template for recording custom settings on an audio amplification system, or components thereof, the audio amplification system, or components thereof, having a control panel, comprising a plurality of rotating control knobs on rotating spindles, the template comprising a template blank shaped for accommodation by the amplifier control panel, the template blank having cut-outs or bores facilitating the application of the template to the amplifier control panel, over the control knobs or rotating spindles thereby surrounding the control knob or rotating spindles and providing a full 360 degree field surrounding the control knob for the direct marking of control knob settings directly in a full 360 degree field around the control knobs.

2. The removable template of claim 1 which is produced from plastic stock.

3. The removable template of claim 1 which is produced from paper stock.

4. The removable template of claim 1 which is produced from metal stock.

5. The removable template of claim 1 which is produced from foam stock.

6. The removable template of claim 1 further comprising a means for removably attaching the template to the amplifier control panel.

7. The removable template of claim 6 wherein the means for removably attaching the template to the amplifier control panel is an adhesive.

8. The removable template of claim 2 wherein the template blank is magnetically backed and the surface of the amplifier control panel is attracted to the magnetic backing.

9. A method for recording custom settings on an audio amplification system, or components thereof, the method comprising:
   a) providing a removable template for recording custom settings on an audio amplification system, or components thereof, the audio amplification system, or components thereof, having a control panel, comprising a plurality of rotating control knobs on rotating spindles, the template comprising a template blank shaped for accommodation by the amplifier control panel, the template blank having cut-outs or bores facilitating the application of the template to the amplifier control panel, over the control knobs or rotating spindles thereby surrounding the control knob or rotating spindles and providing a full 360 degree field surrounding the control knob for the direct marking of control knob settings directly in a full 360 degree field around the control knobs and
   b) marking the removable template with a writing instrument to record preferred custom amplifier settings, and related indicia.

10. The method of claim 9 wherein the removable template is produced from plastic stock.

11. The removable template of claim 9 which is produced from paper stock.

12. The removable template of claim 9 which is produced from metal stock.

13. The removable template of claim 9 which is produced from foam stock.

14. The removable template of claim 9 further comprising a means for removably attaching the template to the amplifier control panel.

15. The removable template of claim 14 wherein the means for removably attaching the template to the amplifier control panel is an adhesive.

16. The removable template of claim 9 wherein the template blank is magnetically backed and the surface of the amplifier control panel is attracted to the magnetic backing.

* * * * *